United States Patent [19]
Dehnert

[11] 4,082,619
[45] Apr. 4, 1978

[54] METHOD OF FORMING A COMB-LIKE ELECTRODE STRUCTURE

[76] Inventor: Heinz Dehnert, Am Bahnhof, D-7801 Hugstetten-March, Germany

[21] Appl. No.: 755,291

[22] Filed: Dec. 29, 1976

[30] Foreign Application Priority Data

Jan. 7, 1976 Germany .............................. 2600340

[51] Int. Cl.² .......................... C25D 5/02; C25D 5/12; C25D 7/06
[52] U.S. Cl. ....................................... 204/15; 346/165
[58] Field of Search ................... 346/165; 204/15, 40, 204/41

[56] References Cited

U.S. PATENT DOCUMENTS

| | | | |
|---|---|---|---|
| 2,834,723 | 5/1958 | Robinson | 204/15 |
| 2,949,592 | 8/1960 | Smiley | 204/15 |
| 2,959,525 | 11/1960 | Ritt, Jr. et al. | 204/15 |
| 3,240,684 | 3/1966 | Martin et al. | 204/15 |
| 3,317,917 | 5/1967 | Little, Jr. et al. | 346/165 |
| 3,618,118 | 11/1971 | Lloyd | 346/165 |
| 3,827,056 | 7/1974 | Vano | 346/165 |
| 4,000,045 | 12/1976 | Rotzow | 204/15 |

Primary Examiner—T. M. Tufariello
Attorney, Agent, or Firm—Pollock, VandeSande & Priddy

[57] ABSTRACT

A comb-like electrode arrangement, for use in a recording instrument, comprises a photochemically produced platen having a plurality of individual, closely adjacent, parallel conductor tracks of copper thereon, said copper tracks being electrolytically coated with at least one metal selected from the group consisting of titanium, vanadium, chromium, manganese, iron, cobalt and nickel.

2 Claims, 2 Drawing Figures

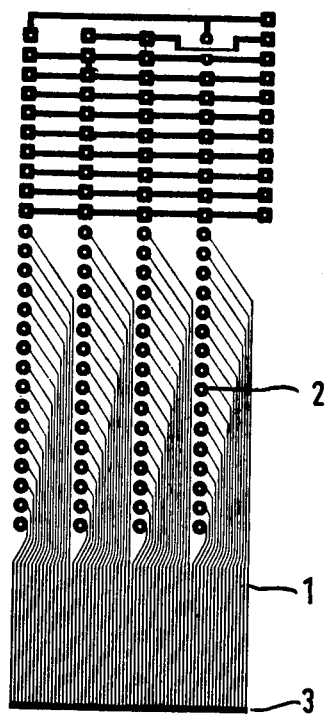
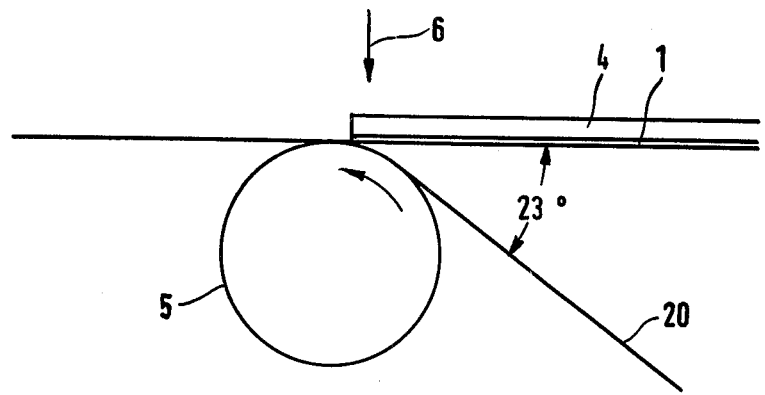

METHOD OF FORMING A COMB-LIKE ELECTRODE STRUCTURE

The present invention concerns a comb-like electrode structure for use as the recording electrodes of a recording instrument, the arrangement being such that the individual electrodes of said structure can be energized (or driven) independently to effect a current flow between the individual electrode and a counter electrode which produces a visible mark on a record carrier medium moving under the electrode structure. Comb-like electrode structures of this general type have been suggested heretofore, and make possible point-by-point recordings. The record carrier medium which is used for this purpose, and which passes under the comb-like electrode arrangement, may comprise, for example, a coated paper. If one of the recording electrodes in the comb-like electrode structure is activated, a spark-over will occur and will form a pin-point mark on the record carrier medium or plated paper. Due to the fact that drive of the individual electrodes is inertialess, it becomes possible to record curve traces of very high frequency.

In one prior art structure, the comb-like electrodes consist of individual pin-shaped electrodes which are arranged side-by-side and held in position relative to one another by being embedded in an electrode carrier. This known arrangement has the disadvantage that the distance between the individual electrodes is relatively large, resulting in a poor resolution of the curves to be recorded.

Another known form of comb-like electrode, of the general type described, is produced by the etching of a nickel-chrome steel plate. The individual electrodes produced by this technique are disposed in relatively close proximity to each other, but the manufacturing technique involved is extremely complicated and the cost of such electrode arrangements is accordingly very high. This arrangement has further the additional disadvantage that the individual recording electrodes possess relatively great specific ohmic resistance, requiring relatively high voltages for their operation, and the marks produced by the electrode arrangement therefore become relatively large in size.

It is the purpose of the present invention to provide a comb-like electrode arrangement which is so designed that it can be manufactured at low cost, and wherein the individual electrodes are nevertheless in close proximity to each other so that small-sized marks can be produced. The invention achieves these results through the provision of a comb-like electrode arrangement of the above-specified type, wherein the comb-like electrode arrangement consists of a photochemically produced platen having a plurality of closely adjacent conductor tracks of copper, and wherein said copper tracks are provided at least within the comb-like region with a coating that contains at least one metal from the group that comprises titanium, vanadium, chromium, manganese, iron, cobalt and nickel. Such an electrode arrangement can be produced at low cost and, due to said coating, exhibits a comparatively long service life.

The conductor tracks forming the individual electrodes are produced photochemically in standard manner, that is, a light-sensitive layer is placed over a foil layer of copper which is in turn supported by a plate of nonconductive synthetic material (e.g., epoxy), and said light-sensitive layer is exposed to a pattern of light in known manner and then treated chemically so that a great number of conductor tracks consisting of copper will remain on said plate. In one form of the invention, the distance between the individual electrodes, or the conductor tracks, equals 0.3 mm; the plate dimensions widen away from the comb-like region thereof; and the conductor tracks are similarly widened in this widened region of the plate, to form a hookup region on the plate where each individual conductor track can be connected to an associated electronic circuit operating to activate and drive the conductor track.

The conductor tracks within the comb-like region are then coated, said coating preferably being applied by electrolytic means. In a first embodiment of the invention, the copper conductor tracks are initially coated with nickel and subsequently with chromium. The individual electrodes consist therefore of a copper layer arranged on the platen, with a nickel layer placed onto the copper layer, followed by a chromium layer. In another embodiment of the invention, the copper conductor tracks are first nickel-plated, followed by an iron layer, and finally by a thin layer of gold. The platen is then subjected to a thermal treatment during which the gold diffuses into the iron layer. Relatively hard conductor tracks are obtained in both cases, and their maximum operating life is satisfactory. When the points of the conductor tracks are worn away, the used-up platen is readily replaced with an inexpensive new platen simply by pulling the old platen out of an associated mounting structure and inserting a new platen into said mounting structure.

The platen can be beveled in wedge shape in back of the forward comb-like region. It is also feasible to provide a comb-like electrode arrangement on both the front side and on the rear side of the platen. This dual arrangement achieves an improvement in the resolution or in the alternative, allows an increase in the distance between the individual conductor tracks while the quality of resolution remains unchanged.

Suitable metals for the coatings are titanium, vanadium, chromium, manganese, iron, cobalt and nickel. The metals should be selected with the aim of producing sufficiently hard layers. It has been found that, in addition to the above listed metals, molybdenum, tungsten and rhenium are also suitable materials for the coatings; but these latter metals can be attached electrolytically to the conductor tracks only with difficulty. If these latter metals are to be used therefore, it is preferable to produce the conductor tracks photochemically not from copper but from these other metals or their alloys.

The platen is prepared preferably by the use of an epoxy plate having a layer of copper thereon. It is also possible to use, in place of the layer of copper, a layer containing at least one metal from the group comprising titanium, vanadium, chromium, manganese, iron, cobalt, nickel, molybdenum, tungsten and rhenium.

In the case of the known prior art comb-like electrode arrangements, each individual, springy electrode presses against the plated paper moving under it with a force of approximately 1p. The electrode arrangement of the present invention, however, presses against the paper with approximately 20p/mm of comb width, and two or three recording electrodes are provided in each one mm of comb width.

The foregoing description of the present invention will be more fully appreciated by reference to the accompanying drawings wherein:

FIG. 1 depicts a cutout top view of a recording comb constructed in accordance with, and fabricated by the method of, the present invention, and FIG. 2 shows the layout of the recording comb within a recording instrument.

In the electrode arrangement shown in FIG. 1, the conductor platen comprises a large number of closely adjacent conductor tracks 1 which run parallel to each other and which individually terminate at the rear of the platen in terminal contacts 2. During the manufacturing process all of the conductor tracks 1 are initially connected to one another at the front end of the platen by means of a metallic strip 3. This front end of the platen, together with the metallic strip 3, is sawn off as soon as the conductor tracks have been provided with a hard coating, to leave separate conductor elements at the front end of the finished platen.

The resultant platen is used in a recording instrument of the type shown in FIG. 2, wherein a sheet of coated paper 20 moves below the platen 4. The incoming coated paper 20 forms an angle of between 20° and 30°, and preferably approximately 23°, with the platen 4, the conductor tracks 1 being arranged on said platen. Below the line of contact between the coated paper 20 and the platen 4, there is arranged a soft rubber roller 5 which turns in direction shown by the arrow. The recording comb has a width of approximately 40 mm, and is pressed in the direction of arrow 6 with a force of approximately 800p against the coated paper 20, or the rubber roller 5 respectively.

I claim:

1. The method of fabricating a recording instrument of the type comprising a comb-like electrode arrangement having individual electrodes which can be driven independently to effect a current flow between each individual electrode and a counter electrode to produce a mark on a record medium moving under the electrode arrangement, said method comprising the steps of fabricating a planar platen by photochemically processing a copper foil layer on a non-conductive support plate to provide a conductive pattern of copper on said support plate consisting of a comb-like region of generally parallel, spaced, closely adjacent elongated copper tracks having corresponding first ends thereof interconnected to one another adjacent one edge of said support plate by a strip of copper extending transverse to the directions of elongation of said tracks, thereafter electrolytically coating said comb-like region of said copper pattern with a layer of nickel, thereafter electrolytically coating said nickel layer with a further layer of metal from the group consisting of chromium and iron, and, following said coating steps, severing the portion of said support plate having said strip of copper thereon from the remainder of said support plate to leave said first corresponding ends of said elongated tracks in separated spaced relation to one another along said one edge of said platen, beveling the rear side of said platen along said one edge of said platen into a wedge shape, removably placing said platen in a mounting structure with said beveled edge of said platen being positioned in line contact with a coated paper record medium the plane of which is disposed at an angle of between 20° and 30° to the plane of said platen, and positioning a soft rubber roller below the line of contact between said record medium and said platen to resiliently urge said record medium into forcible engagement with the beveled edge of said platen.

2. The method of claim 1 wherein said further layer of metal is iron, said method including the additional step of coating said iron layer with a layer of gold, and thereafter subjecting said platen to a thermal treatment operative to cause said gold to diffuse into said layer of iron.

* * * * *